United States Patent
Kim et al.

(10) Patent No.: US 9,345,136 B1
(45) Date of Patent: May 17, 2016

(54) PACKAGE SUBSTRATES, SEMICONDUCTOR PACKAGES INCLUDING THE SAME, ELECTRONIC SYSTEMS INCLUDING THE SAME, AND MEMORY CARDS INCLUDING THE SAME

(71) Applicant: SK hynix Inc., Icheon-si, Gyeonggi-do (KR)

(72) Inventors: Seung Jee Kim, Seongnam-si (KR); Won Duck Jung, Icheon-si (KR)

(73) Assignee: SK Hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/716,452

(22) Filed: May 19, 2015

(30) Foreign Application Priority Data

Jan. 22, 2015 (KR) .................. 10-2015-0010833

(51) Int. Cl.
*H05K 1/02* (2006.01)
*H05K 1/11* (2006.01)
*H01L 23/00* (2006.01)
*H01L 23/522* (2006.01)

(52) U.S. Cl.
CPC .......... *H05K 1/0298* (2013.01); *H01L 23/5226* (2013.01); *H01L 24/09* (2013.01); *H01L 24/17* (2013.01); *H01L 24/48* (2013.01); *H05K 1/115* (2013.01); *H05K 1/117* (2013.01)

(58) Field of Classification Search
CPC combination set(s) only.
See application file for complete search history.

(56) References Cited

U.S. PATENT DOCUMENTS

2005/0133905 A1   6/2005   Zhao et al.
2009/0057916 A1   3/2009   Yeom et al.

*Primary Examiner* — Jeremy C Norris
(74) *Attorney, Agent, or Firm* — William Park & Associates Ltd.

(57) ABSTRACT

A package substrate includes a core layer, first external interconnection lines on a top surface of the core layer, and internal interconnection lines. The first external interconnection lines include a first outermost external interconnection line on an edge of the core layer, and the internal interconnection lines include an outermost internal interconnection line in the edge of the core layer. A first bonding pad is disposed on the first outermost external interconnection line and exposed in a first bonding region of the core layer. A second bonding pad is disposed on the outermost internal interconnection line and exposed in a second bonding region of the core layer. The first bonding region is spaced apart from a chip attachment region by a first distance, and the second bonding region is spaced apart from the chip attachment region by a second distance greater than the first distance.

22 Claims, 8 Drawing Sheets

PACKAGE SUBSTRATES, SEMICONDUCTOR PACKAGES INCLUDING THE SAME, ELECTRONIC SYSTEMS INCLUDING THE SAME, AND MEMORY CARDS INCLUDING THE SAME

CROSS-REFERENCE TO RELATED APPLICATION

The present application claims priority under 35 U.S.C 119(a) to Korean Patent Application No. 10-2015-0010833, filed on Jan. 22, 2015, in the Korean Intellectual Property Office, which is incorporated herein by reference in its entirety.

BACKGROUND

1. Technical Field

Various embodiments generally relate to semiconductor packages and, more particularly, to package substrates, semiconductor packages including the same, electronic systems including the same, and memory cards including the same.

2. Related Art

Recently, advanced semiconductor packages or advanced system-in-packages (SiPs) having a high capacity are increasingly in demand with the development of mobile phones, personal digital assistants (PDAs) and mobile products. In response to such demands, semiconductor packages have been scaled down to provide thin and compact semiconductor packages.

To realize high performance semiconductor packages having a high capacity, multi-layered substrates have been widely used as package substrates. Each of the multi-layered substrates may be configured to include a plurality of circuit interconnection lines disposed at different levels, and the circuit interconnection lines disposed at different levels may be electrically connected to each other through vias. In the event that a plurality of chips are attached to the multi-layered substrate, the vias should be disposed in edges of the multi-layered substrate because of the limitation of an area or a space that uppermost circuit interconnection lines occupy. This may lead to an increase in size or planar area of the semiconductor packages.

SUMMARY

According to an embodiment, there may be provided a package substrate. The package substrate may include a substrate core layer, a plurality of first external circuit interconnection lines disposed on a top surface of the substrate core layer, and a plurality of internal circuit interconnection lines disposed in the substrate core layer. The plurality of first external circuit interconnection lines may include a first outermost external circuit interconnection line located on the substrate core layer and adjacent to an edge of the substrate core layer, and the plurality of internal circuit interconnection lines may include an outermost internal circuit interconnection line located in the substrate core layer and adjacent to the edge of the substrate core layer. A first bonding pad may be disposed on the first outermost external circuit interconnection line and exposed in a first bonding region of the substrate core layer. A second bonding pad may be disposed on the outermost internal circuit interconnection line and exposed in a second bonding region of the substrate core layer. The first bonding region may be spaced apart from a chip attachment region by a first distance, and the second bonding region may be spaced apart from the chip attachment region by a second distance, the second distance being which is greater than the first distance.

According to an embodiment, there may be provided a semiconductor package. The semiconductor package may include a substrate core layer, a plurality of first external circuit interconnection lines disposed on a top surface of the substrate core layer, and a plurality of internal circuit interconnection lines disposed in the substrate core layer. The plurality of first external circuit interconnection lines may include a first outermost external circuit interconnection line located on the substrate core layer and adjacent to an edge of the substrate core layer, and the plurality of internal circuit interconnection lines may include an outermost internal circuit interconnection line located in the substrate core layer and adjacent to the edge of the substrate core layer. A first bonding pad may be disposed on the first outermost external circuit interconnection line and exposed in a first bonding region of the substrate core layer. A second bonding pad may be disposed on the outermost internal circuit interconnection line and exposed in a second bonding region of the substrate core layer. A first chip and a second chip may be sequentially stacked on a chip attachment region of the substrate core layer. A first wire may electrically connect a first chip pad of the first chip to the first bonding pad, and a second wire may electrically connect a second chip pad of the second chip to the second bonding pad. The first bonding region may be spaced apart from a chip attachment region by a first distance, and the second bonding region may be spaced apart from the chip attachment region by a second distance, the second distance being which is greater than the first distance.

According to an embodiment, there may be provided an electronic system including a semiconductor package. The semiconductor package may include a substrate core layer, a plurality of first external circuit interconnection lines disposed on a top surface of the substrate core layer, and a plurality of internal circuit interconnection lines disposed in the substrate core layer. The plurality of first external circuit interconnection lines may include a first outermost external circuit interconnection line located on the substrate core layer and adjacent to an edge of the substrate core layer, and the plurality of internal circuit interconnection lines may include an outermost internal circuit interconnection line located in the substrate core layer and adjacent to the edge of the substrate core layer. A first bonding pad may be disposed on the first outermost external circuit interconnection line and exposed in a first bonding region of the substrate core layer. A second bonding pad may be disposed on the outermost internal circuit interconnection line and exposed in a second bonding region of the substrate core layer. A first chip and a second chip may be sequentially stacked on a chip attachment region of the substrate core layer. A first wire may electrically connect a first chip pad of the first chip to the first bonding pad, and a second wire may electrically connect a second chip pad of the second chip to the second bonding pad. The first bonding region may be spaced apart from a chip attachment region by a first distance, and the second bonding region may be spaced apart from the chip attachment region by a second distance, the second distance being which is greater than the first distance.

According to an embodiment, there may be provided a memory card including a semiconductor package. The semiconductor package may include a substrate core layer, a plurality of first external circuit interconnection lines disposed on a top surface of the substrate core layer, and a plurality of internal circuit interconnection lines disposed in the substrate core layer. The plurality of first external circuit interconnection lines may include a first outermost external circuit interconnection line located on the substrate core layer and adjacent to an edge of the substrate core layer, and the plurality of internal circuit interconnection lines may include an outermost internal circuit interconnection line located in the substrate core layer and adjacent to the edge of the substrate core layer. A first bonding pad may be disposed on the first outermost external circuit interconnection line and exposed in a first bonding region of the substrate core layer. A second bonding pad may be disposed on the outermost internal circuit interconnection line and exposed in a second bonding region of the substrate core layer. A first chip and a second chip may be sequentially stacked on a chip attachment region of the substrate core layer. A first wire may electrically connect a first chip pad of the first chip to the first bonding pad, and a second wire may electrically connect a second chip pad of the second chip to the second bonding pad. The first bonding region may be spaced apart from a chip attachment region by a first distance, and the second bonding region may be spaced apart from the chip attachment region by a second distance, the second distance being which is greater than the first distance.

DETAILED DESCRIPTION

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on", "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to limit the scope of the present disclosure.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). Semiconductor chips or chips may be obtained by separating a semiconductor substrate or a wafer where electronic circuits are integrated into a plurality of pieces using a die sawing process. The term "chip" used herein may correspond to a memory chip such as a dynamic random access memory (DRAM) chip, a static random access memory (SRAM) chip, a flash memory chip, a magnetic random access memory (MRAM) chip, a resistive random access memory (ReRAM) chip, a ferroelectric random access memory (FeRAM) chip, or a phase change random access memory (PcRAM) chip. Alternatively, the term "chip" used herein may correspond to a logic chip, for example, a non-memory chip.

As used herein, the term "and/or" includes any and all combinations of one or more of the associated listed items.

Various embodiments may be directed to package substrates, semiconductor packages including the same, electronic systems including the same, and memory cards including the same.

Figure 1:
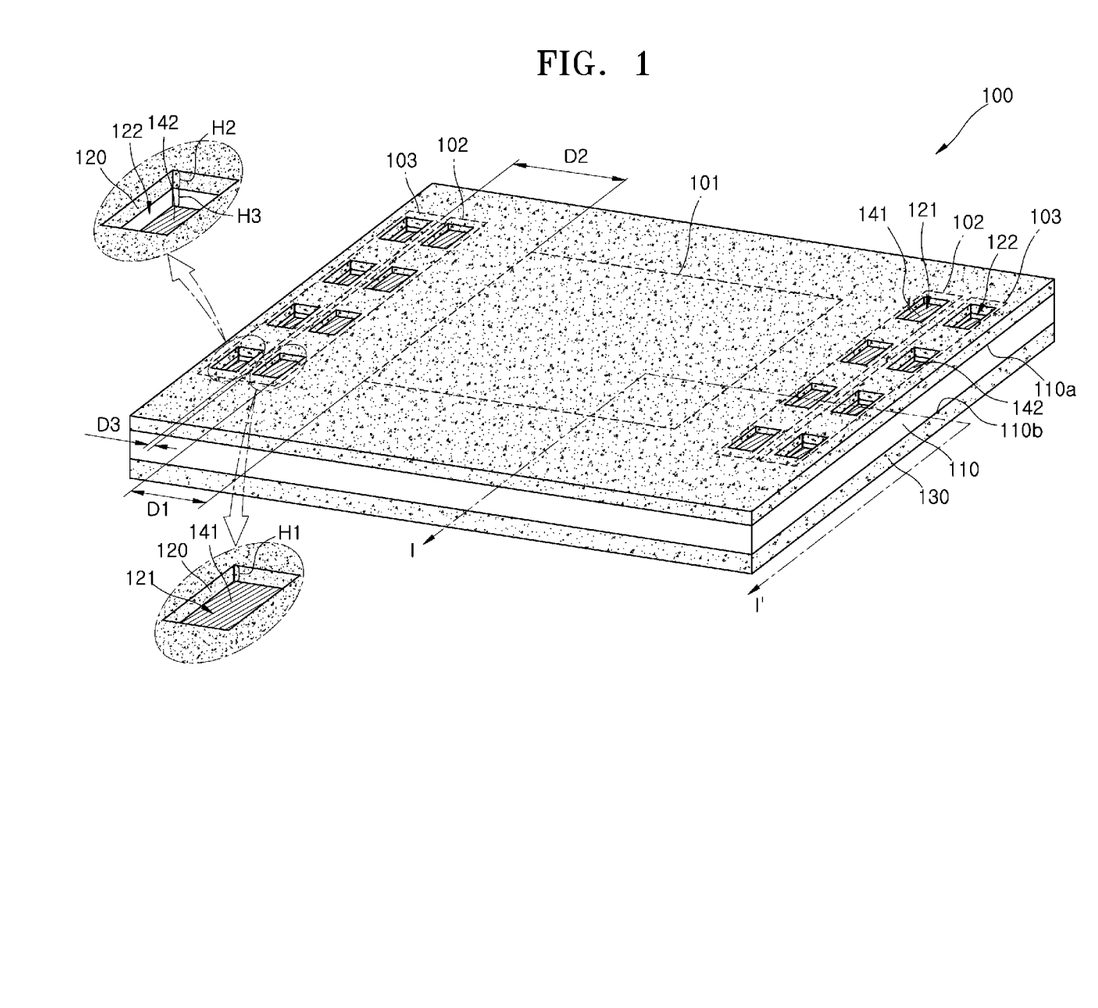
FIG. 1 is a perspective view illustrating a representation of an example of a package substrate according to an embodiment.

FIG. 1 is a perspective view illustrating a representation of an example of a package substrate 100 according to an embodiment. Referring to FIG. 1, the package substrate 100 may include a first insulation layer 120, a second insulation layer 130, and a substrate core layer 110. The substrate core layer 110 may be located between the first and second insulation layers 120 and 130. The package substrate 100 may have a chip attachment region 101, a pair of first bonding regions 102, and a pair of second bonding regions 103. The chip attachment region 101 may be allocated in a central region of the package substrate 100. One of the pair of first bonding regions 102 and one of the pair of second bonding regions 103 may be disposed in a first edge of the package substrate 100 to be adjacent to a first side of the chip attachment region 101. The other of the pair of first bonding regions 102 and the other of the pair of second bonding regions 103 may be disposed in a second edge of the package substrate 100 to be adjacent to a second side of the chip attachment region 101 opposite to the first edge of the package substrate 100.

The first bonding regions 102 may be spaced apart from the chip attachment region 101 by a first distance D1. The second bonding regions 103 may be spaced apart from the chip attachment region 101 by a second distance D2. The first bonding region 102 and the second bonding region 103 located at the first side of the chip attachment region 101 may be spaced apart from each other by a third distance D3. Similarly, the first bonding region 102 and the second bonding region 103 located at the second side of the chip attachment region 101 may also be spaced apart from each other by the third distance D3. The substrate core layer 110 may be a single insulation layer. In some embodiments, the substrate core layer 110 may be a single layer of glass epoxy material. Alternatively, the substrate core layer 110 may be an insulation layer having a multi-layered structure. In such an example, a plurality of insulation layers constituting the substrate core layer 110 may include the same material. A plurality of chips, for example, a first chip and a second chip may be mounted on the chip attachment region 101. In such an example, bonding wires connected to the first chip may be bonded to the pair of first bonding regions 102 so that the first chip is electrically connected to circuit interconnection lines in the substrate core layer 110, and bonding wires connected to the second chip may be bonded to the pair of second bonding regions 103 so that the second chip is electrically connected to the circuit interconnection lines in the substrate core layer 110. The chip attachment region 101 may be located in the central region of the package substrate 100. Although FIG. 1 illustrates an example in which the chip attachment region 101 has a tetragonal shape in a plan view, the present disclosure is not limited thereto. For example, in some embodiments, the chip attachment region 101 may have a polygonal shape other than a tetragonal shape in a plan view according to a planar shape of the chips which are attached thereto.

The first distance D1 between the chip attachment region 101 and each first bonding region 102 may correspond to a gap or a space between sides of the first bonding region 102 and the chip attachment region 101 which are closest to each other. Each of the first bonding regions 102 may have a stripe pattern in a plan view and may include a plurality of first bonding pads 141 arrayed therein. In some embodiments, each of the first bonding regions 102 may be disposed to be parallel or substantially parallel with any one side of the chip attachment region 101. The second distance D2 between the chip attachment region 101 and each second bonding region 103 may correspond to a gap or a space between sides of the second bonding region 103 and the chip attachment region 101 which are closest to each other. The second distance D2 may be greater than the first distance D1. For example, the second bonding regions 103 may be disposed to be farther than the first bonding regions 102 from the chip attachment region 101. Each of the second bonding regions 103 may have a stripe pattern in a plan view and may include a plurality of second bonding pads 142 arrayed therein. In some embodiments, the second bonding regions 103 may be spaced apart from the first bonding regions 102 by the third distance D3 and may be disposed to be parallel or substantially parallel with the first bonding regions 102.

The first insulation layer 120 may be disposed on a top surface 110a of the substrate core layer 110. In some embodiments, the first insulation layer 120 may include a solder resist layer. The second insulation layer 130 may be disposed on a bottom surface 110b of the substrate core layer 110. In some embodiments, the second insulation layer 130 may include a solder resist layer. The first insulation layer 120 may have a plurality of first openings 121 located in the first bonding regions 102 and a plurality of second openings 122 located in the second bonding regions 103. The first bonding pads 141 may be respectively exposed by the first openings 121 that penetrate the first insulation layer 120. The second bonding pads 142 may be respectively exposed by the second openings 122 that penetrate the first insulation layer 120.

In the first openings 121, a depth H1 from a top surface of the first insulation layer 120 to top surfaces of the first bonding pads 141 may be substantially less than a thickness of the first insulation layer 120. In the second openings 122, a depth H2+H3 from a top surface of the first insulation layer 120 to top surfaces of the second bonding pads 142 may be greater than a thickness of the first insulation layer 120. Each of the first openings 121 may expose a sidewall of a portion of the first insulation layer 120. Each of the second openings 122 may expose a sidewall of a portion of the first insulation layer 120 as well as a sidewall of a portion of the substrate core layer 110. Top surfaces of the first bonding pads 141 may be located at a level higher than a level of top surface of the second bonding pads 142.

Figure 2:
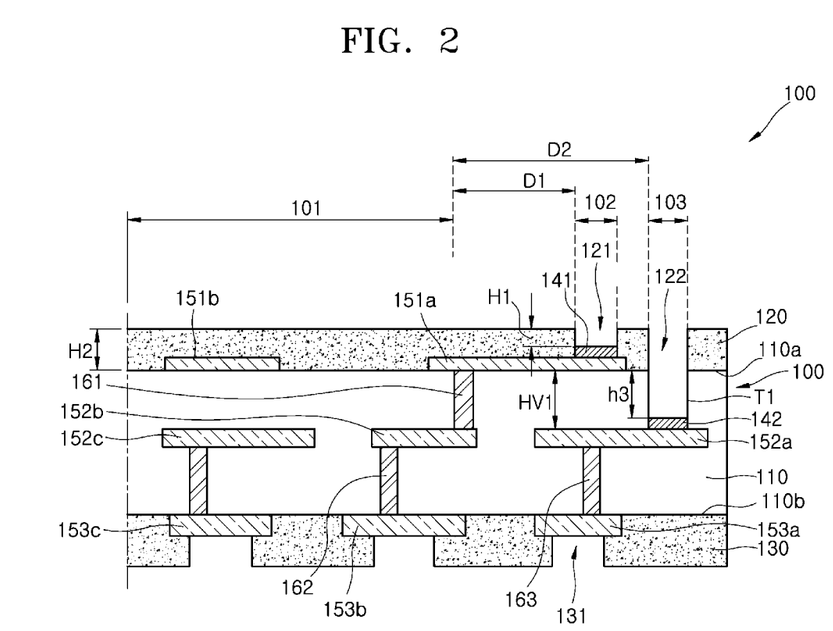
FIG. 2 is a cross-sectional representation of an example of a view taken along a line I-I' of FIG. 1.

FIG. 2 is a cross-sectional representation of an example of a view taken along a line I-I' of FIG. 1. Referring to FIG. 2, the package substrate 100 may include external circuit interconnection lines 151a, 151b, 153a, 153b and 153c and internal circuit interconnection lines 152a, 152b and 152c. For example, a plurality of first external circuit interconnection lines 151a and 151b of the external circuit interconnection lines 151a, 151b, 153a, 153b and 153c may be disposed on the top surface 110a of the substrate core layer 110. The first external circuit interconnection lines 151a and 151b may be electrically isolated from each other or may be electrically connected to each other. The number and/or shape of the first external circuit interconnection lines 151a and 151b may be set to be different according to a signal processing scheme and configuration of the package substrate 100. The plurality of first external circuit interconnection lines 151a and 151b may be located at substantially the same level (i.e., the same vertical height). The first external circuit interconnection line 151a may correspond to an outermost external circuit interconnection line of the plurality of first external circuit interconnection lines 151a and 151b. A portion of the first outermost external circuit interconnection line 151a may be located in one of the first bonding regions 102.

The internal circuit interconnection lines 152a, 152b and 152c may be disposed in the substrate core layer 110. The internal circuit interconnection lines 152a, 152b and 152c may be located at substantially the same level (i.e., the same vertical height) in the substrate core layer 110. At least two of the internal circuit interconnection lines 152a, 152b and 152c may be electrically isolated from each other or may be electrically connected to each other. The number and/or shape of the internal circuit interconnection lines 152a, 152b and 152c may be set to be different according to a signal processing scheme and configuration of the package substrate 100. The internal circuit interconnection line 152a may correspond to an outermost internal circuit interconnection line of the plurality of internal circuit interconnection lines 152a, 152b and 152c. A portion of the internal circuit interconnection line 152a may be located in one of the second bonding regions 103. A level difference corresponding to a first height HV1 in a vertical direction may exist between the top surfaces of the internal circuit interconnection lines 152a, 152b and 152c and the bottom surfaces of the first external circuit interconnection lines 151a and 151b. The first height HV1 may be set to be different according to fabrication processes of the package substrate 100.

A plurality of second external circuit interconnection lines 153a, 153b and 153c of the external circuit interconnection lines 151a, 151b, 153a, 153b and 153c may be disposed on the bottom surface 110b of the substrate core layer 110. The plurality of second external circuit interconnection lines 153a, 153b and 153c may be located at substantially the same level (i.e., the same vertical height). At least two of the second external circuit interconnection lines 153a, 153b and 153c may be electrically isolated from each other or may be electrically connected to each other. The number and/or shape of the second external circuit interconnection lines 153a, 153b and 153c may be set to be different according to a signal processing scheme and configuration of the package substrate 100.

At least one of the first external circuit interconnection lines 151a and 151b may be electrically connected to at least one of the internal circuit interconnection lines 152a, 152b and 152c through a first via 161 disposed in the substrate core layer 110. A bottom surface and a top surface of the first via 161 may contact a top surface of one (e.g., the internal circuit interconnection line 152b) of the internal circuit interconnection lines 152a, 152b and 152c and a bottom surface of one (e.g., the first external circuit interconnection line 151a) of the first external circuit interconnection lines 151a and 151b, respectively. One of the internal circuit interconnection lines 152a, 152b and 152c may be electrically connected to one of the second external circuit interconnection lines 153a, 153b and 153c through a second via 162 or a third via 163. For example, a bottom surface and a top surface of the second or third via 162 or 163 may contact a top surface of one (e.g., the second external circuit interconnection line 153b or 153a) of the second external circuit interconnection lines 153a, 153b and 153c and a bottom surface of one (e.g., the internal circuit interconnection line 152b or 152a) of the internal circuit interconnection lines 152a, 152b and 152c, respectively. A configuration of the first, second and third vias 161, 162 and 163 may be different according to use of the package substrate 100. The embodiments, for example, provide the configuration of only the vias 161, 162 and 163 connected to the outermost circuit interconnection lines 151a, 152a and 153a, but are not limited in these examples of embodiments.

The first insulation layer 120 may be disposed on the top surface 110a of the substrate core layer 110 to cover the first external circuit interconnection lines 151a and 151b. The first insulation layer 120 may have a certain thickness H2. For example, portions of the first insulation layer 120 directly contacting the top surface 110a of the substrate core layer 110 may have the thickness H2 that is uniform or substantially uniform. As described with reference to FIG. 1, the first insulation layer 120 may have the first openings 121 located in the first bonding regions 102 and the second openings 122 located in the second bonding regions 103. One of the first openings 121 may expose a portion of the first external circuit interconnection line 151a, and one of the first bonding pads 141 may be disposed on the exposed portion of the first external circuit interconnection line 151a. A top surface of the first bonding pad 141 may also be exposed by the first opening 121 located in the first bonding region 102. In the first openings 121, the depth H1 from the top surface of the first insulation layer 120 to the top surfaces of the first bonding pads 141 may have a value that remains after subtracting a thickness of the first external circuit interconnection line 151a and a thickness of the first bonding pads 141 from the thickness H2 of the first insulation layer 120.

The substrate core layer 110 may have a trench T1 located in the second bonding region 103 and may be vertically aligned with the second opening 122. A depth of the trench T1 may be substantially equal to the first height HV1 that corresponds to a level difference between the top surfaces of the internal circuit interconnection lines 152a, 152b and 152c and the bottom surfaces of the first external circuit interconnection lines 151a and 151b. A portion of the internal circuit interconnection line 152a may be exposed by the second opening 122 and the trench T1 which are vertically aligned with each other, and one of the second bonding pads 142 may be disposed on the exposed portion of the internal circuit interconnection line 152a. A top surface of the second bonding pad 142 may also be exposed by the second opening 122 and the trench T1 in the second bonding region 103. In the second opening 122, a depth H2+H3 from the top surface of the first insulation layer 120 to the top surface of the second bonding pad 142 may be substantially equal to a value that remains after subtracting a thickness of the second bonding pad 142 from a sum of the thickness H2 of the first insulation layer 120 and the depth HV1 of the trench T1.

The second insulation layer 130 may be disposed on the bottom surface 110b of the substrate core layer 110 to cover the second external circuit interconnection lines 153a, 153b and 153c. The second insulation layer 130 may have third openings 131 that expose portions of the second external circuit interconnection lines 153a, 153b and 153c respectively. Although not illustrated in FIG. 2, external connection terminals such as solder balls may be disposed on the exposed portions of the second external circuit interconnection lines 153a, 153b and 153c, respectively.

The first external circuit interconnection line 151a of the first external circuit interconnection lines 151a and 151b may be electrically connected to the internal circuit interconnection line 152b through the first via 161 disposed in the substrate core layer 110. The internal circuit interconnection line 152b may be electrically connected to the second external circuit interconnection line 153b through the second via 162 disposed in the substrate core layer 110. A signal transmission path including the first external circuit interconnection line 151a, the first via 161, the internal circuit interconnection line 152b, and the second via 162 may be provided between the first bonding pad 141 and the second external circuit interconnection line 153b.

The internal circuit interconnection line 152a of the internal circuit interconnection lines 152a, 152b and 152c may be electrically connected to the second external circuit interconnection line 153a through the third via 163 disposed in the substrate core layer 110. The third via 163 may be located at the same level as the second via 162. A signal transmission path including the internal circuit interconnection line 152a and the third via 163 may be provided between the second bonding pad 142 and the second external circuit interconnection line 153a. The signal transmission path between the first bonding pad 141 and the second external circuit interconnection line 153b may include two vias, for example, the first and second vias 161 and 162. The signal transmission path between the second bonding pad 142 and the second external circuit interconnection line 153a may include a single via, for example, the third via 163. In such an example, the first and second vias 161 and 162 may be disposed in the chip attachment region 101 and/or in an interface region between the chip attachment region 101 and the first bonding region 102, and the third via 163 may be disposed between the chip attachment region 101 and the second bonding region 103. In an embodiment, all of the first, second and third vias 161, 162 and 163 may be disposed between a central portion and the second bonding region 103 of the package substrate 100. In an embodiment, it may be unnecessary to dispose even at least one of the vias in an outermost edge between the second bonding region 103 and a sidewall of the package substrate 100.

Figure 3:
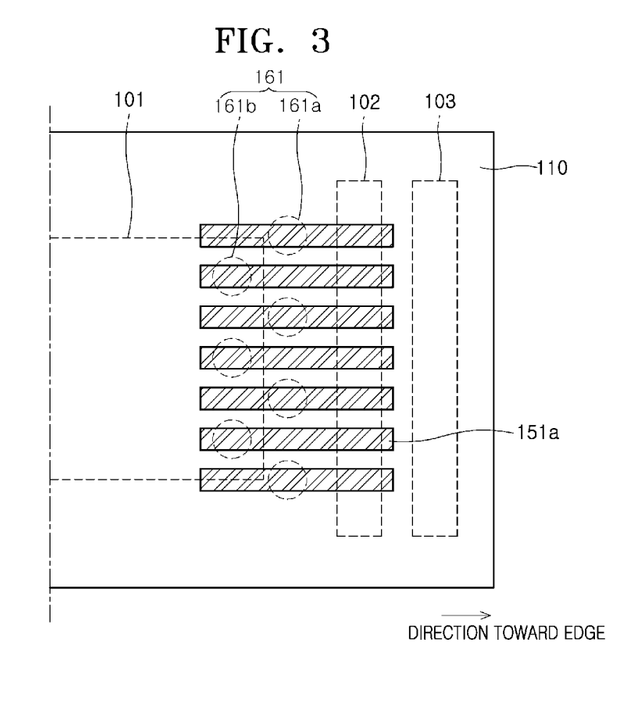
FIG. 3 is a plan view illustrating a representation of an example of positions of first vias included in a package substrate according to an embodiment.
Figure 4:
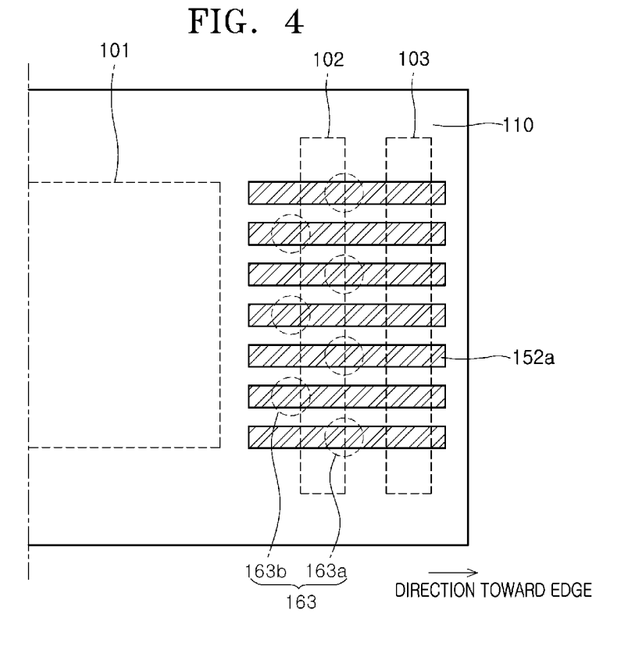
FIG. 4 is a plan view illustrating a representation of an example of positions of third vias included in a package substrate according to an embodiment.

FIG. 3 is a plan view illustrating a representation of an example of positions of first vias 161 included in a package substrate according to an embodiment. FIG. 4 is a plan view illustrating a representation of an example of positions of third vias 163 included in a package substrate according to an embodiment. In FIGS. 3 and 4, the same reference numerals as used in FIGS. 1 and 2 denote the same elements. Some of the elements illustrated in FIG. 2 are omitted in FIGS. 3 and 4.

First, as illustrated in FIG. 3, each of the first external circuit interconnection lines 151a disposed on the top surface of the substrate core layer 110 may have a stripe shape that extends in one direction, for example, in a horizontal direction of the drawing. Each of the first external circuit interconnection lines 151a may include a first end adjacent to an edge of the substrate core layer 110 and a second end adjacent to a central portion of the substrate core layer 110. In such an example, the first ends of the first external circuit interconnection lines 151a may be located between the first and second bonding regions 102 and 103 adjacent to an edge of the substrate core layer 110. The first external circuit interconnection lines 151a may extend from their first ends to pass through the first bonding region 102 and to reach the chip attachment region 101. In such an example, the second ends of the first external circuit interconnection lines 151a may be disposed in the chip attachment region 101. Although FIG. 3 illustrates an example in which the first external circuit interconnection lines 151a extend into the chip attachment region 101, the present disclosure is not limited thereto. For example, in some embodiments, the second ends of the first external circuit interconnection lines 151a may be located in a region between the chip attachment region 101 and the first bonding region 102. As illustrated by dotted circles in FIG. 3, the first vias 161 may include first vias 161a disposed between the chip attachment region 101 and the first bonding region 102 and first vias 161b disposed in the chip attachment region 101, and the first vias 161a and the first vias 161b may be alternately arrayed in a zigzag fashion along a direction parallel with the first bonding region 102. The first vias 161a may be disposed to overlap with odd-numbered ones of the first external circuit interconnection lines 151a, and the first vias 161b may be disposed to overlap with even-numbered ones of the first external circuit interconnection lines 151a. The first vias 161 illustrated in FIGS. 1 and 2 may also be arrayed in a zigzag fashion in a plan view, like the embodiment of FIG. 3. As described above, the first vias 161a may be disposed between the chip attachment region 101 and the first bonding region 102, and the first vias 161b may be disposed in the chip attachment region 101. For example, all of the first vias 161 may be disposed between the central portion and the first bonding region 102 of the substrate core layer 110, to thus prevent a planar area of a package substrate from increasing due to the first vias 161.

Referring to FIG. 4, each of the internal circuit interconnection lines 152a disposed in the substrate core layer 110 may have a stripe shape that extends in one direction, for example, in a horizontal direction of the drawing. Each of the internal circuit interconnection lines 152a may include a first end adjacent to an edge of the substrate core layer 110 and a second end adjacent to a central portion of the substrate core layer 110. In such an example, the first ends of the internal circuit interconnection lines 152a may be located between the second bonding region 103 and a sidewall of the substrate core layer 110. The internal circuit interconnection lines 152a may extend from their first ends to pass through the first and second bonding regions 102 and 103 and to reach a region between the chip attachment region 101 and the first bonding region 102. As illustrated by dotted circles in FIG. 4, the third vias 163 may include third vias 163a and third vias 163b, and the third vias 163a and the third vias 163b may be alternately arrayed in a zigzag fashion along a direction parallel with the first bonding region 102. The third vias 163 illustrated in FIGS. 1 and 2 may also be arrayed in a zigzag fashion in a plan view, like the embodiment of FIG. 4. The third vias 163 may be disposed between the second bonding region 103 and the chip attachment region 101 to overlap with the internal circuit interconnection lines 152a. A distance between the first bonding region 102 and a central point of each third via 163a may be less than a distance between the first bonding region 102 and a central point of each third via 163b. As such, all of the third vias 163a and 163b may be disposed between the second bonding region 103 and the chip attachment region 101 of the substrate core layer 110. Each of the internal circuit interconnection lines 152a may sufficiently extend toward the chip attachment region 101 to have a sufficient length. The internal circuit interconnection lines 152a may completely overlap with the third vias 163.

Figure 5:
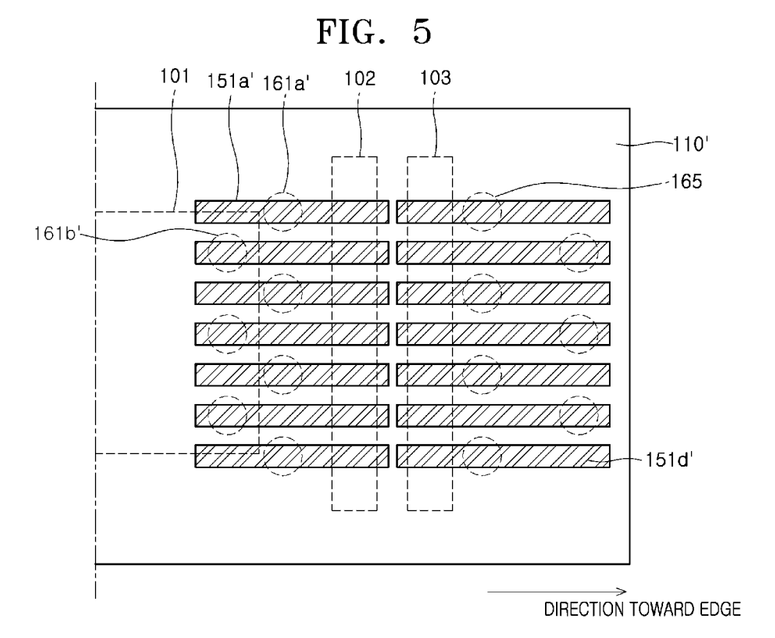
FIG. 5 is a plan view illustrating a representation of an example of a general package substrate to describe advantages of a package substrate illustrated in FIG. 1.

FIG. 5 is a plan view illustrating a representation of an example of a general package substrate to describe advantages of the package substrate 100 illustrated in FIGS. 1 and 2. In FIG. 5, the same reference numerals as used in FIG. 3 denote the same elements. Referring to FIG. 5, in the case of a general package substrate, first external circuit interconnection lines 151a' may be disposed to overlap with the first bonding region 102, and first external circuit interconnection lines 151d' corresponding to outermost ones of the first external circuit interconnection lines may be disposed to overlap with the second bonding region 103. In the general package substrate, the first external circuit interconnection lines 151a' and 151d' may be located at the same level. That is, all of the first external circuit interconnection lines 151a' and 151d' may be disposed on a top surface of a substrate core layer 110'. In such an example, vias 161a' and 161b' for electrically connecting the first external circuit interconnection lines 151a' to internal circuit interconnection lines disposed in the substrate core layer 110' may be arrayed at the same locations as the vias 161a and 161b described with reference to FIG. 3. However, locations of fourth vias 165 for electrically connecting the first external circuit interconnection lines 151d' to the internal circuit interconnection lines disposed in the substrate core layer 110' may be different from the locations of the third vias 163 described with reference to FIG. 4. Specifically, since the first external circuit interconnection lines 151a' are arrayed to have an insufficient pitch, it may be difficult to extend the first external circuit interconnection lines 151d' toward the chip attachment region 101 so that the extensions of the first external circuit interconnection lines 151d' are disposed between the first external circuit interconnection lines 151a'. In addition, it may not be preferable to extend the first external circuit interconnection lines 151d' to detour the first bonding region 102 and the first external circuit interconnection lines 151a' because signal transmission paths including the first external circuit interconnection lines 151d' become longer and additional regions are required to dispose the detour routes of the first external circuit interconnection lines 151d'. Because of the above limitations, it may be difficult to dispose the fourth vias 165 for electrically connecting the first external circuit interconnection lines 151d' to the internal circuit interconnection lines of the substrate core layer 110' in a region between the second bonding region 103 and the chip attachment region 101. Accordingly, it may be inevitable to dispose the fourth vias 165 in an outermost edge region between the second bonding region 103 and a sidewall of the substrate core layer 110'. Even in such a case, an additional area for disposing the fourth vias 165 may also be required in the outermost edge region of the substrate core layer 110'. As a result, there may be some limitations in reducing a planar area of the general package substrate. In contrast, according to the embodiments, the third vias 163 may be disposed between the chip attachment region 101 and the second bonding region, as described with reference to FIG. 4. Thus, an additional planar area for disposing the third vias 163 may not be required.

Figure 6:
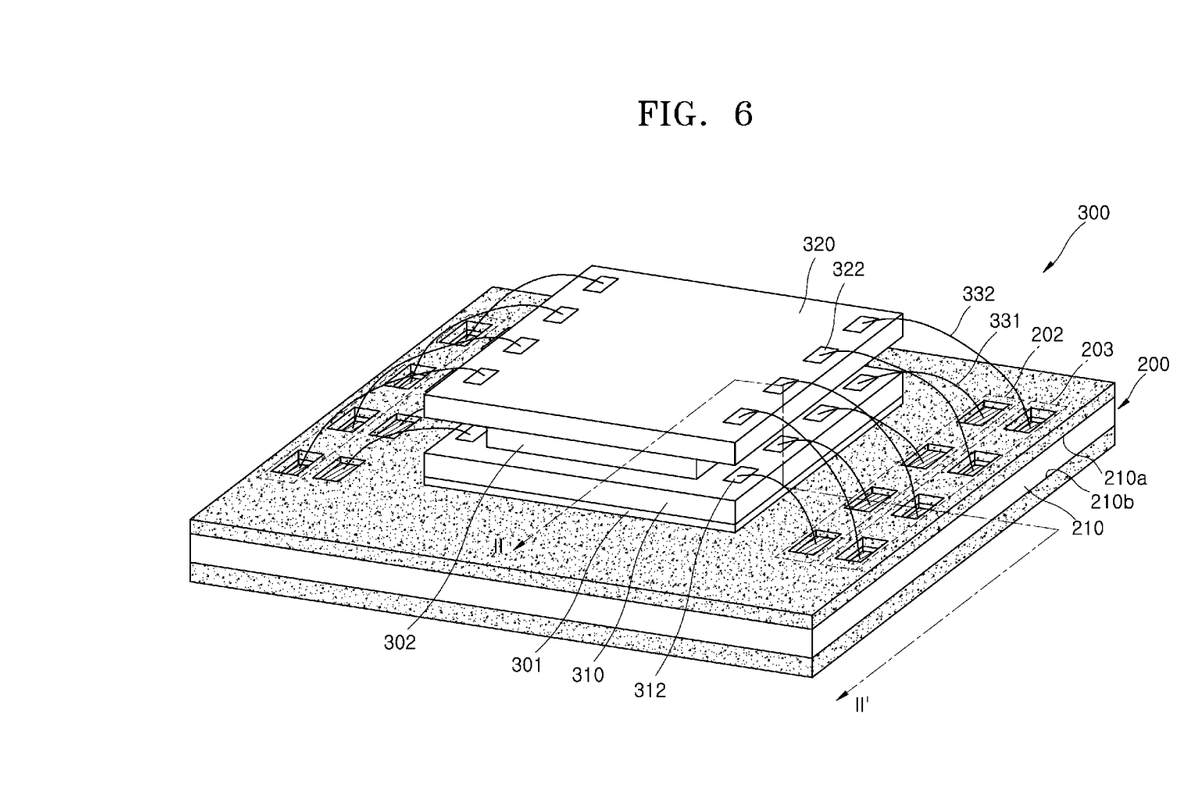
FIG. 6 is a perspective view illustrating a representation of an example of a semiconductor package according to an embodiment.
Figure 7:
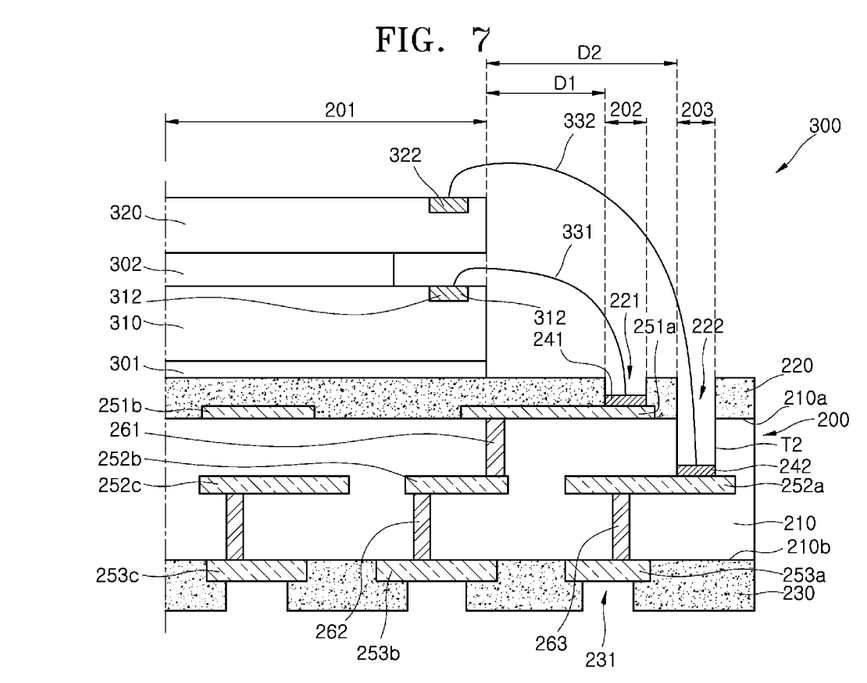
FIG. 7 is a cross-sectional representation of an example of a view taken along a line II-II' of FIG. 6.

FIG. 6 is a perspective view illustrating a representation of an example of a semiconductor package 300 according to an embodiment. FIG. 7 is a cross-sectional representation of an example of a view taken along a line II-II' of FIG. 6. Referring to FIGS. 6 and 7, the semiconductor package 300 may include a first chip 310 and a second chip 320. The first chip 310 and the second chip 320 may be sequentially stacked on a surface of a multi-layered substrate 200. The multi-layered substrate 200 may include a substrate core layer 210 having a top surface 210a and a bottom surface 210b. The substrate core layer 210 may be comprised of a single insulation layer. In some embodiments, the substrate core layer 210 may be a glass epoxy layer. Alternatively, the substrate core layer 210 may be an insulation layer having a multi-layered structure. In such an example, a plurality of insulation layers constituting the substrate core layer 210 may include the same material. A first insulation layer 220 may be disposed on the top surface 210a of the substrate core layer 210. A second insulation layer 230 may be disposed on the bottom surface 210b of the substrate core layer 210. In some embodiments, each of the first and second insulation layers 220 and 230 may be a solder resist layer.

The multi-layered substrate 200 may have a chip attachment region 201, a pair of first bonding regions 202, and a pair of second bonding regions 203. The chip attachment region 201 may be allocated in a central region of the multi-layered substrate 200. One of the pair of first bonding regions 202 and one of the pair of second bonding regions 203 may be disposed in a first edge of the multi-layered substrate 200 to be adjacent to a first side of the chip attachment region 201. The other of the pair of first bonding regions 202 and the other of the pair of second bonding regions 203 may be disposed in a second edge of the multi-layered substrate 200 to be adjacent to a second side of the chip attachment region 201 opposite to the first edge of the multi-layered substrate 200. Although FIG. 7 illustrates an example in which the chip attachment region 201 has a tetragonal shape in a plan view, the present disclosure is not limited thereto. For example, in some embodiments, the chip attachment region 201 may have a polygonal shape other than a tetragonal shape in a plan view according to planar shapes of the first and second chips 310 and 320. The first bonding regions 202 may be spaced apart from the chip attachment region 201 by a first distance D1. The first distance D1 between the chip attachment region 201 and each first bonding region 202 may correspond to a gap or a space between sides of the first bonding region 202 and the chip attachment region 201 which are closest to each other. Each of the first bonding regions 202 may have a stripe shape in a plan view and may include a plurality of first bonding pads 241 arrayed therein. In some embodiments, each of the first bonding regions 202 may be disposed to be parallel with any one side or sides of the chip attachment region 201. The second bonding regions 203 may be spaced apart from the chip attachment region 201 by a second distance D2. The second distance D2 between the chip attachment region 201 and each second bonding region 203 may correspond to a gap or a space between sides of the second bonding region 203 and the chip attachment region 201 which are closest to each other. The second distance D2 may be greater than the first distance D1. For example, the second bonding regions 203 may be disposed to be farther than the first bonding regions 202 from the chip attachment region 201. Each of the second bonding regions 203 may have a stripe shape in a plan view and may include a plurality of second bonding pads 242 arrayed therein. In some embodiments, the second bonding regions 203 may be spaced apart from the first bonding regions 202 by a certain distance and may be disposed to be parallel with the first bonding regions 202.

The first and second chips 310 and 320 may be stacked on the substrate core layer 210 with the first insulation layer 220 disposed between the first chip 310 and the substrate core layer 210. A bottom surface of the first chip 310 may be attached to a top surface of the first insulation layer 220 using an adhesive agent 301. A top surface of the first chip 310 may be attached to a bottom surface of an intermediate structure 302 including an adhesive agent. A bottom surface of the second chip 320 may be attached to a top surface of the intermediate structure 302. A plurality of first chip pads 312 may be disposed on the top surface of the first chip 310. The first chip pads 312 may be exposed to a space between edges of the first chip 310 and edges of the second chip 320. A plurality of second chip pads 322 may be disposed on a top surface of the second chip 320. The second chip pads 322 may be exposed at the top surface of the second chip 320. Although FIGS. 6 and 7 illustrate an example in which the first or second chip pads 312 or 322 are disposed on both edges of the first or second chip 310 or 320, the present disclosure is not limited thereto. For example, in some embodiments, an array scheme of the first and second chip pads 312 and 322 may be different according to functions of the first and second chips 310 and 320.

A plurality of first external circuit interconnection lines 251a and 251b may be disposed on the top surface 210a of the substrate core layer 210 and may be covered with the first insulation layer 220. The first external circuit interconnection lines 251a and 251b may be electrically isolated from each other or may be electrically connected to each other. The number of the first external circuit interconnection lines 251a and 251b may be set to be different according to a signal processing scheme and configuration of the package substrate 200. The plurality of first external circuit interconnection lines 251a and 251b may be located at substantially the same level (i.e., the same vertical height). The first external circuit interconnection line 251a may correspond to an outermost circuit interconnection line of the plurality of first external circuit interconnection lines 251a and 251b. A portion of the first external circuit interconnection line 251a may be located in one of the first bonding regions 202.

A plurality of internal circuit interconnection lines 252a, 252b and 252c may be disposed in the substrate core layer 210. The internal circuit interconnection lines 252a, 252b and 252c may be located at substantially the same level (i.e., the same vertical height) in the substrate core layer 210. The internal circuit interconnection lines 252a, 252b and 252c may be electrically isolated from each other or may be electrically connected to each other. The internal circuit interconnection line 252a may correspond to an outermost circuit interconnection line of the plurality of internal circuit interconnection lines 252a, 252b and 252c. A portion of the internal circuit interconnection line 252a may be located in one of the second bonding regions 203.

A plurality of second external circuit interconnection lines 253a, 253b and 253c may be disposed on the bottom surface 210b of the substrate core layer 210, and the second external circuit interconnection lines 253a, 253b and 253c may be covered with the second insulation layer 230. The plurality of second external circuit interconnection lines 253a, 253b and 253c may be located at substantially the same level (i.e., the same vertical height). At least two of the second external circuit interconnection lines 253a, 253b and 253c may be electrically isolated from each other or may be electrically connected to each other. The number of the second external circuit interconnection lines 253a, 253b and 253c may be set to be different according to a signal processing scheme and configuration of the package substrate 200.

At least one of the first external circuit interconnection lines 251a and 251b may be electrically connected to at least one of the internal circuit interconnection lines 252a, 252b and 252c through a first via 261 disposed in the substrate core layer 210. A bottom surface and a top surface of the first via 261 may contact a top surface of one (e.g., the internal circuit interconnection line 252b) of the internal circuit interconnection lines 252a, 252b and 252c and a bottom surface of one (e.g., the first external circuit interconnection line 251a) of the first external circuit interconnection lines 251a and 251b, respectively. One of the internal circuit interconnection lines 252a, 252b and 252c may be electrically connected to one of the second external circuit interconnection lines 253a, 253b and 253c through a second via 262 or a third via 263. For example, a bottom surface and a top surface of the second or third via 262 or 263 may contact a top surface of one (e.g., the second external circuit interconnection line 253b or 253a) of the second external circuit interconnection lines 253a, 253b and 253c and a bottom surface of one (e.g., the internal circuit interconnection line 252b or 252a) of the internal circuit interconnection lines 252a, 252b and 252c, respectively. A configuration of the first, second and third vias 261, 262 and 263 may be different according to use of the package substrate 200. For example, an embodiment provides the configuration of only the vias 261, 262 and 263 which are connected to the outermost circuit interconnection lines 251a, 252a and 253a.

The first insulation layer 220 may have a plurality of first openings 221 located in the first bonding regions 202. The first insulation layer 220 may have a plurality of second openings 222 located in the second bonding regions 203. One of the first openings 221 may expose a portion of the first external circuit interconnection line 251a, and one of the first bonding pads 241 may be disposed on the exposed portion of the first external circuit interconnection line 251a. A top surface of the first bonding pad 241 may also be exposed by the first opening 221 located in the first bonding region 202. The first bonding pads 241 may be respectively exposed by the first openings 221 that penetrate the first insulation layer 220. Although not illustrated in the drawings, in some other embodiments, a line-shaped trench instead of the plurality of first openings 221 may be provided to expose the plurality of first bonding pads 241 and the first insulation layer 220 between the first bonding pads 241 in each first bonding region 202. In the first openings 221, a depth from a top surface of the first insulation layer 220 to top surfaces of the first bonding pads 241 may have a value that remains after subtracting a thickness of the first external circuit interconnection line 251a and a thickness of the first bonding pads 241 from a thickness of the first insulation layer 220.

The substrate core layer 210 may have a trench T2 that is located in the second bonding region 203 and is vertically aligned with the second opening 222. A depth of the trench T2 may be substantially equal to a level difference between the top surfaces of the internal circuit interconnection lines 252a, 252b and 252c and the bottom surfaces of the first external circuit interconnection lines 251a and 251b. A portion of the internal circuit interconnection line 252a may be exposed by the second opening 222 and the trench T2 which are vertically aligned with each other, and one of the second bonding pads 242 may be disposed on the exposed portion of the internal circuit interconnection line 252a. A top surface of the second bonding pad 242 may also be exposed by the second opening 222 and the trench T2 in the second bonding region 203. Although the present embodiment illustrates an example in which one of the second openings 222 and one of the trenches T2 expose only one of the second bonding pads 242, the present disclosure is not limited thereto. For example, in some embodiments, the plurality of second bonding pads 242 and the first insulation layer 220 between the plurality of second bonding pads 242 may be exposed by a single line-shaped second opening and a single line-shaped trench which are vertically aligned with each other. In each second opening 222, a depth from the top surface of the first insulation layer 220 to the top surface of the second bonding pad 242 may be substantially equal to a value that remains after subtracting a thickness of the second bonding pad 242 from a sum of the thickness of the first insulation layer 220 and the depth of the trench T2.

The second insulation layer 230 may have third openings 231 that expose portions of the second external circuit interconnection lines 253a, 253b and 253c respectively. Although not illustrated in the drawings, external connection terminals such as solder balls may be disposed on the exposed portions of the second external circuit interconnection lines 253a, 253b and 253c, respectively.

The first external circuit interconnection line 251a of the first external circuit interconnection lines 251a and 251b may be electrically connected to the internal circuit interconnection line 252b through the first via 261 disposed in the substrate core layer 210. The internal circuit interconnection line 252b may be electrically connected to the second external circuit interconnection line 253b through the second via 262 disposed in the substrate core layer 210. A signal transmission path including the first external circuit interconnection line 251a, the first via 261, the internal circuit interconnection line 252b, and the second via 262 may be provided between the first bonding pad 241 and the second external circuit interconnection line 253b.

The internal circuit interconnection line 252a of the internal circuit interconnection lines 252a, 252b and 252c may be electrically connected to the second external circuit interconnection line 253a through the third via 263 disposed in the substrate core layer 210. The third via 263 may be located at the same level as the second via 262. For example, a signal transmission path including the internal circuit interconnection line 252a and the third via 263 may be provided between the second bonding pad 242 and the second external circuit interconnection line 253a. The signal transmission path between the first bonding pad 241 and the second external circuit interconnection line 253b may include two vias, for example, the first and second vias 261 and 262. The signal transmission path between the second bonding pad 242 and the second external circuit interconnection line 253a may include a single via, for example, the third via 263. In such an example, the first and second vias 261 and 262 may be disposed in the chip attachment region 201 and in an interface region between the chip attachment region 201 and the first bonding region 202, and the third via 263 may be disposed between the chip attachment region 201 and the second bonding region 203. As such, all of the first, second and third vias 261, 262 and 263 may be disposed between a central portion and the second bonding region 203 of the package substrate 200. Accordingly, it may be unnecessary to dispose even at least one of the vias in an outermost edge between the second bonding region 203 and a sidewall of the package substrate 200.

The first chip pad 312 of the first chip 310 may be electrically connected to the first bonding pad 241 through a first wire 331. A signal may be transmitted from the first chip pad 312 to the second external circuit interconnection line 253b through the first wire 331, the first bonding pad 241, the first external circuit interconnection line 251a, the first via 261, the internal circuit interconnection line 252b and the second via 262. The second chip pad 322 of the second chip 320 may be electrically connected to the second bonding pad 242 through a second wire 332. Thus, a signal may be transmitted from the second chip pad 322 to the second external circuit interconnection line 253a through the second wire 332, the second bonding pad 242, the internal circuit interconnection line 252a and the third via 263.

The semiconductor package described above may be applied to various electronic systems.

Figure 8:
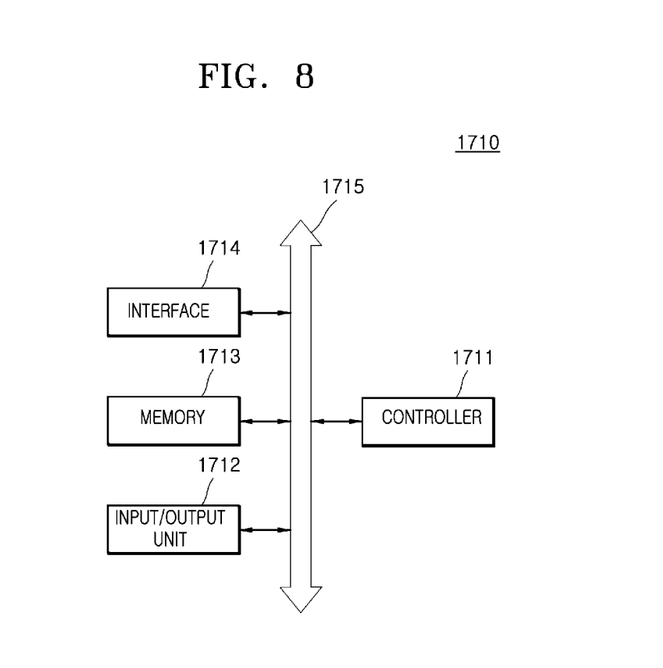
FIG. 8 is a block diagram illustrating a representation of an example of an electronic system including at least one of semiconductor packages in accordance with some embodiments.

Referring to FIG. 8, the embedded package in accordance with an embodiment may be applied to an electronic system 1710. The electronic system 1710 may include a controller 1711, an input/output unit 1712, and a memory 1713. The controller 1711, the input/output unit 1712 and the memory 1713 may be coupled with one another through a bus 1715 providing a path through which data are transmitted.

For example but not limited to, the controller 1711 may include at least any one of at least one microprocessor, at least one digital signal processor, at least one microcontroller, and logic devices capable of performing the same functions as these components. At least one of the controller 1711 and the memory 1713 may include at least any one of the semiconductor package according to the embodiments of the present disclosure. The input/output unit 1712 may include at least one selected among a keypad, a keyboard, a display device, a touch screen and so forth. The memory 1713 is a device for storing data. The memory 1713 may store data and/or commands to be executed by the controller 1711, and the likes.

The memory 1713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this example, the electronic system 1710 may stably store a large amount of data in a flash memory system.

The electronic system 1710 may further include an interface 1714 configured to transmit and receive data to and from a communication network. The interface 1714 may be a wired or wireless type. For example, the interface 1714 may include an antenna or a wired or wireless transceiver.

The electronic system 1710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

In an embodiment wherein the electronic system 1710 is an equipment capable of performing wireless communication, the electronic system 1710 may be used in a communication system such as, for example but not limited to, CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 9:
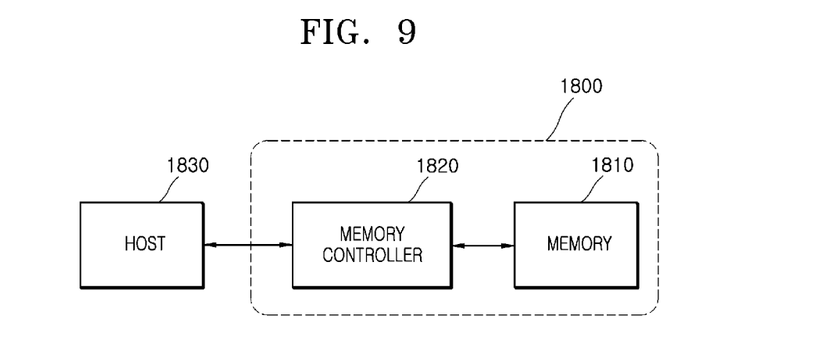
FIG. 9 is a block diagram illustrating a representation of an example of an electronic system including at least one of semiconductor packages in accordance with some embodiments.

Referring to FIG. 9, the embedded package in accordance with the embodiments may be provided in the form of a memory card 1800. For example, the memory card 1800 may include a memory 1810 such as a nonvolatile memory device and a memory controller 1820. The memory 1810 and the memory controller 1820 may store data or read stored data.

The memory 1810 may include at least any one among nonvolatile memory devices to which the packaging technology of the embodiments of the present disclosure is applied. The memory controller 1820 may control the memory 1810 such that stored data is read out or data is stored in response to a read/write request from a host 1830.

The embodiments have been disclosed above for illustrative purposes. Those skilled in the art will appreciate that various modifications, additions and substitutions are possible, without departing from the scope and spirit of the present disclosure as including the accompanying claims.

What is claimed is:
1. A package substrate comprising:
a substrate core layer;
a plurality of first external circuit interconnection lines disposed on a top surface of the substrate core layer, the plurality of first external circuit interconnection lines including a first outermost external circuit interconnection line located on the substrate core layer and adjacent to an edge of the substrate core layer;
a plurality of internal circuit interconnection lines disposed in the substrate core layer, the plurality of internal circuit interconnection lines including an outermost internal circuit interconnection line located in the substrate core layer and adjacent to the edge of the substrate core layer;
a first bonding pad disposed on the first outermost external circuit interconnection line and exposed in a first bonding region of the substrate core layer; and
a second bonding pad disposed on the outermost internal circuit interconnection line and exposed in a second bonding region of the substrate core layer,
wherein the first bonding region is spaced apart from a chip attachment region by a first distance, and the second bonding region is spaced apart from the chip attachment region by a second distance, the second distance being greater than the first distance.

2. The package substrate of claim 1, wherein the first bonding region is spaced apart from the second bonding region by a third distance.

3. The package substrate of claim 1, further comprising a plurality of second external circuit interconnection lines disposed on a bottom surface of the substrate core layer.

4. The package substrate of claim 3, further comprising:
a first via configured to electrically connect the first outermost external circuit interconnection line to one of the plurality of internal circuit interconnection lines other than the outermost internal circuit interconnection line;
a second via configured to electrically connect the internal circuit interconnection line connected to the first via to one of the plurality of second external circuit interconnection lines; and
a third via configured to electrically connect the outermost internal circuit interconnection line to another one of the plurality of second external circuit interconnection lines,
wherein the first, second, and third vias are only located between the second bonding region and a central portion of the package substrate.

5. The package substrate of claim 3, further comprising:
a first via disposed in the substrate core layer to electrically connect the first outermost external circuit interconnection line to one of the plurality of internal circuit interconnection lines other than the outermost internal circuit interconnection line;
a second via disposed in the substrate core layer to electrically connect the internal circuit interconnection line connected to the first via to one of the plurality of second external circuit interconnection lines; and
a third via disposed in the substrate core layer to electrically connect the outermost internal circuit interconnection line to another one of the plurality of second external circuit interconnection lines.

6. The package substrate of claim 5, wherein the first via and the second via are disposed in the chip attachment region and/or in an interface region between the chip attachment region and the first bonding region.

7. The package substrate of claim 5,
wherein at least two of the first outermost external circuit interconnection lines are located on the substrate core layer and adjacent to the edge of the substrate core layer, and
wherein the first outermost external circuit interconnection lines extend from the chip attachment region to a region located between the first bonding region and the second bonding region.

8. The package substrate of claim 7,
wherein at least two of the first via are disposed in the substrate core layer to electrically connect the first outermost external circuit interconnection line to one of the plurality of internal circuit interconnection lines, respectively, other than the outermost internal circuit interconnection line,
wherein the first via include even first via located between the chip attachment region and the first bonding region, and odd first via located in the chip attachment region, and
wherein the even and odd first via are configured to form a zigzag pattern.

9. The package substrate of claim 5, wherein the third via is disposed between the chip attachment region and the second bonding region.

10. The package substrate of claim 5,
wherein at least two of the outermost internal circuit interconnection lines are located in the substrate core layer and adjacent to the edge of the substrate core layer, and
wherein the outermost internal circuit interconnection lines extend from a region between a sidewall of the substrate core layer and the second bonding region to a region between the chip attachment region and the first bonding region.

11. The package substrate of claim 10,
wherein at least two of the third via are disposed in the substrate core layer to electrically connect the outermost internal circuit interconnection line to another one of the plurality of second external circuit interconnection lines, respectively,
wherein the third vias are alternately arrayed in a zigzag fashion along a direction parallel with the first bonding region and are disposed between the chip attachment region and the second bonding region.

12. The package substrate of claim 11,
wherein each of the third vias are at least partially located within the first bonding region, and
wherein the outermost internal circuit interconnection lines completely overlap the third vias.

13. The package substrate of claim 3, further comprising a first insulation layer disposed on the top surface of the substrate core layer to cover the plurality of first external circuit interconnection lines,
wherein the first insulation layer has a first opening and a second opening.

14. The package substrate of claim 13, wherein the first opening and the second opening expose the first bonding pad in the first bonding region and the second bonding pad in the second bonding region, respectively.

15. The package substrate of claim 14, wherein a depth of the first opening corresponds to a top surface of the first insulation layer to a top surface of the first bonding pad and is less than a thickness of the first insulation layer.

16. The package substrate of claim 15, wherein a depth of the second opening corresponds to the top surface of the first insulation layer to a top surface of the second bonding pad and is greater than the thickness of the first insulation layer.

17. The package substrate of claim 13, wherein the substrate core layer has a trench vertically aligned with the second opening that penetrates the first insulation layer in the second bonding region.

18. The package substrate of claim 17, wherein the second bonding pad is exposed by the second opening and the trench.

19. The package substrate of claim 18, wherein a depth of the trench is substantially equal to a first height corresponding to a level difference between top surfaces of the internal circuit interconnection lines and bottom surfaces of the first external circuit interconnection lines.

20. The package substrate of claim 13, further comprising a second insulation layer disposed on the bottom surface of the substrate core layer to cover the plurality of second external circuit interconnection lines,
wherein the second insulation layer includes a third opening configured to expose a portion of any one of the plurality of second external circuit interconnection lines.

21. The package substrate of claim 20, wherein the third opening is configured to allow solder balls to be disposed on the exposed portions of the plurality of second external circuit interconnection lines.

22. A semiconductor package comprising:
a substrate core layer;
a plurality of first external circuit interconnection lines disposed on a top surface of the substrate core layer, the plurality of first external circuit interconnection lines including a first outermost external circuit interconnection line located on the substrate core layer and adjacent to an edge of the substrate core layer;
a plurality of internal circuit interconnection lines disposed in the substrate core layer, the plurality of internal circuit interconnection lines including an outermost internal circuit interconnection line located in the substrate core layer and adjacent to the edge of the substrate core layer;
a first bonding pad disposed on the first outermost external circuit interconnection line and exposed in a first bonding region of the substrate core layer;
a second bonding pad disposed on the outermost internal circuit interconnection line and exposed in a second bonding region of the substrate core layer;
a first chip and a second chip sequentially stacked on a chip attachment region of the substrate core layer;
a first wire electrically connecting a first chip pad of the first chip to the first bonding pad; and
a second wire electrically connecting a second chip pad of the second chip to the second bonding pad,
wherein the first bonding region is spaced apart from a chip attachment region by a first distance, and the second bonding region is spaced apart from the chip attachment region by a second distance, the second distance being greater than the first distance.

* * * * *